(12) United States Patent
Ortiz

(10) Patent No.: US 9,577,591 B2
(45) Date of Patent: Feb. 21, 2017

(54) MULTISTAGE DIFFERENTIAL POWER AMPLIFIER HAVING INTERSTAGE POWER LIMITER

(71) Applicant: RF Micro Devices, Inc., Greensboro, NC (US)

(72) Inventor: Jeffery Peter Ortiz, Chandler, AZ (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/715,173

(22) Filed: May 18, 2015

(65) Prior Publication Data

US 2016/0261235 A1 Sep. 8, 2016

Related U.S. Application Data

(60) Provisional application No. 62/129,133, filed on Mar. 6, 2015, provisional application No. 62/132,031, filed on Mar. 12, 2015, provisional application No. 62/133,529, filed on Mar. 16, 2015.

(51) Int. Cl.

| | |
|---|---|
| *H03F 1/52* | (2006.01) |
| *H03F 3/19* | (2006.01) |
| *H03F 1/02* | (2006.01) |
| *H03F 3/21* | (2006.01) |
| *H03F 3/45* | (2006.01) |
| *H03F 1/56* | (2006.01) |

(52) U.S. Cl.
CPC .............. *H03F 3/19* (2013.01); *H03F 1/0205* (2013.01); *H03F 1/0211* (2013.01); *H03F 1/565* (2013.01); *H03F 3/21* (2013.01); *H03F 3/45076* (2013.01); *H03F 2200/102* (2013.01); *H03F 2200/171* (2013.01); *H03F 2200/451* (2013.01); *H03F 2203/45116* (2013.01); *H03F 2203/45316* (2013.01)

(58) Field of Classification Search
CPC .... H03F 3/45; H03F 2200/66; H03F 2200/93; H03F 2200/444; H03F 2200/537; H03F 1/52
USPC .............. 330/145, 165, 195, 207 P, 298, 301
See application file for complete search history.

(56) References Cited

U.S. PATENT DOCUMENTS

| | | | | |
|---|---|---|---|---|
| 4,138,612 A | * | 2/1979 | Schlesinger | ............. H03K 5/08 327/323 |
| 2005/0134386 A1 | * | 6/2005 | Westwick | ................ H03F 3/21 330/301 |
| 2011/0102081 A1 | * | 5/2011 | Su | ............................ H03F 1/52 330/252 |

* cited by examiner

*Primary Examiner* — Steven J Mottola
(74) *Attorney, Agent, or Firm* — Withrow & Terranova, P.L.L.C.

(57) ABSTRACT

A differential power amplifier has at least an input stage and an output stage. A first output stage amplifier is configured to receive a first portion of a differential signal from the input stage at a first output stage input and provide a first amplified signal at a first output stage output. The second output stage amplifier is configured to receive a second portion of the differential signal from the input stage at a second output stage input and provide a second amplified signal at a second output stage output. Power limiter circuitry is connected to the first and/or output stage inputs and is configured to limit a power level of the differential signal prior to being received at the output stage, such that the differential power amplifier and associated filters are not damaged, while the nominal performance of the differential power amplifier at rated power is not significantly affected.

24 Claims, 10 Drawing Sheets

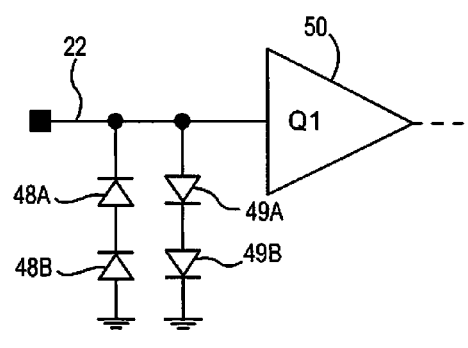 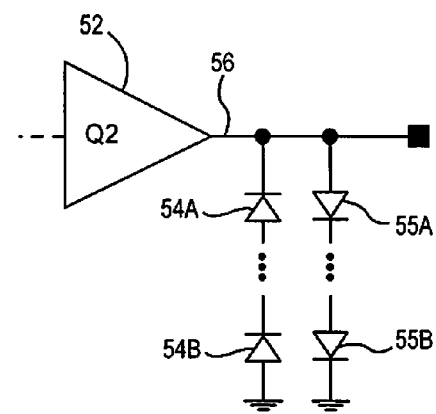
FIG. 2A                    FIG. 2B

MULTISTAGE DIFFERENTIAL POWER AMPLIFIER HAVING INTERSTAGE POWER LIMITER

RELATED APPLICATIONS

This application claims the benefit of U.S. provisional patent application No. 62/129,133, filed Mar. 6, 2015, entitled "DIFFERENTIAL INTERSTAGE POWER LIMITER," the disclosure of which is hereby incorporated herein by reference in its entirety.

This application claims the benefit of U.S. provisional patent application No. 62/132,031, filed Mar. 12, 2015, entitled "COMPACT, HIGH PERFORMANCE, BROADBAND POWER AMPLIFIER ARCHITECTURE," the disclosure of which is hereby incorporated herein by reference in its entirety.

This application claims the benefit of U.S. provisional patent application No. 62/133,529, filed Mar. 16, 2015, entitled "DIFFERENTIAL POWER AMPLIFIER FOR MOBILE CELLULAR ENVELOPE TRACKING," the disclosure of which is hereby incorporated herein by reference in its entirety.

This application is also related to U.S. application Ser. No. 14/715,175, filed May 18, 2015, entitled "OUTPUT MATCHING NETWORK FOR DIFFERENTIAL POWER AMPLIFIER," the disclosure of which is hereby incorporated herein by reference in its entirety.

This application is also related to U.S. application Ser. No. 14/715,181, filed May 18, 2015, entitled "DIFFERENTIAL POWER AMPLIFIER FOR MOBILE CELLULAR ENVELOPE TRACKING," the disclosure of which is hereby incorporated herein by reference in its entirety.

FIELD OF THE DISCLOSURE

The present disclosure relates to power amplifier circuitry, and specifically to differential power amplifiers for use in a mobile device.

BACKGROUND

Modern mobile devices continue to demand an increasing amount of operating time from a single battery charge. Accordingly, power management is a primary concern for many mobile device manufacturers. One major source of power consumption within a mobile device is the power amplifier used in the transmission of wireless signals. A well designed power amplifier may reduce the power requirements of the mobile device in which it is incorporated, thereby significantly extending the battery life of the mobile device.

During a mobile phone calibration, the input power of the power amplifier is swept to a power level as high as ~10 dBm and to a maximum supply voltage of ~4.5 V. Recently, however, envelope trackers have been integrated into the mobile phones. Most, if not all, envelope trackers have a boost mode that can raise the maximum power amplifier supply voltage to ~5.5 V. This combination of high drive level and power supply voltage can result in a peak output power 3-4 dB above the normal operating conditions. This puts the power amplifier at risk of being damaged, and more recently, puts any surface acoustic wave (SAW) or bulk acoustic wave (BAW) duplex filters at risk of being damaged because these filters are being aggressively reduced in size, which limits their maximum safe power dissipation. It would be beneficial to limit power for power amplifiers during this mobile phone calibration stage, especially for those power amplifiers having envelope trackers, in order to avoid damaging SAW or BAW filters at the output of the power amplifier.

The present disclosure describes a differential power amplifier having a differential interstage power limiter that is most effective under these unique operating conditions to limit excess output power.

SUMMARY

A differential power amplifier is disclosed that has at least an input stage and an output stage. The input stage has at least one input and at least one output. The input stage is configured to provide a differential signal having a first portion and a second portion. The output stage may comprise a first output stage amplifier and a second output stage amplifier. The first output stage amplifier is configured to receive the first portion of the differential signal at a first output stage input and provide a first amplified signal at a first output stage output. The second output stage amplifier is configured to receive the second portion of the differential signal at a second output stage input and provide a second amplified signal at a second output stage output. The differential power amplifier also comprises first power limiter circuitry connected to the first output stage input and configured to limit a power level of the first portion of the differential signal prior to being received at the first output stage input by the first output stage amplifier. In this manner, the first power limiter circuitry limits the voltage at the differential power amplifier such that the differential power amplifier and associated filters are not damaged, while the nominal performance of the differential power amplifier at rated power is not significantly affected.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 2A shows related art using diode limiters at the input of a first stage (Q1) amplifier.

FIG. 2B shows related art using diode limiters at an output of a single-ended second stage (Q2) amplifier.

DETAILED DESCRIPTION

During calibration of a mobile phone, the input power to a cellular handset power amplifier can reach ~10 dBm and at a power supply voltage as much as 5.5 V. Under such conditions the peak output power can exceed normal operating conditions by as much as 3-4 dB. Some power amplifier designs have been damaged under such conditions. But more recently, SAW or BAW filters at the output of the power amplifier are more at risk of being damaged because these filters are being reduced in size every generation, which lowers their maximum safe power dissipation. The present disclosure describes a differential power amplifier comprising a differential interstage power limiter that is most effective under these unique operating conditions to limit excess output power. The term "differential interstage power limiter" is used to refer to power limiter circuitry that is placed after the output of a first, or earlier, stage amplifier and at the input of a second, or later, stage amplifier.

A differential power amplifier is disclosed that has at least a first stage and a second stage. The differential power amplifier comprises at least one first stage amplifier having at least one Q1 input and at least one Q1 output. The differential power amplifier also comprises a plurality of second stage amplifiers. Each of the second stage amplifiers has at least one Q2 input and at least one Q2 output. First power limiter circuitry is connected to at least one Q2 input of at least one of the plurality of second stage amplifiers. In this manner, the first power limiter circuitry is configured to limit the voltage at the differential power amplifier such that the differential power amplifier and associated filters are not damaged, while the nominal performance of the differential power amplifier at rated power is not significantly affected.

Figure 1:
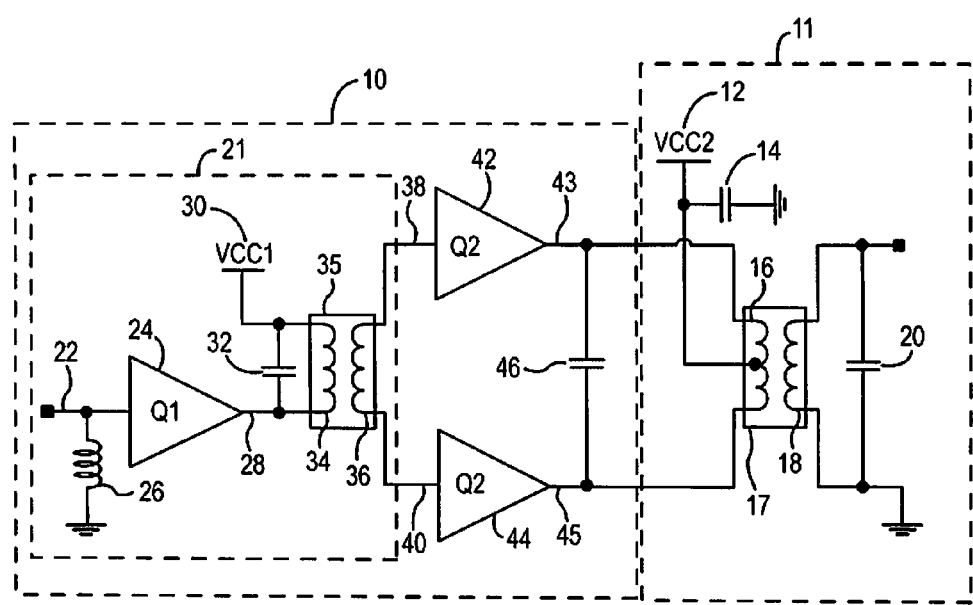
FIG. 1 is a schematic of a differential power amplifier.

FIG. 1 is a schematic of a differential power amplifier 10. The schematic in FIG. 1 depicts a differential power amplifier design that generates enough output power that it may destroy SAW or BAW duplex filters under certain operating conditions, such as calibration of a mobile phone, where the input power to a cellular handset power amplifier can reach ~10 dBm and at a power supply voltage as much as 5.5 V, and the peak output power can exceed normal operating conditions by as much as 3-4 dB. The design in FIG. 1 is somewhat unique in that it has a differential output stage, which has several advantages over a single-ended output stage, as discussed more fully in co-owned related application U.S. application Ser. No. 14/715,181, filed May 18, 2015, entitled "DIFFERENTIAL POWER AMPLIFIER FOR MOBILE CELLULAR ENVELOPE TRACKING." Some of these advantages include better power supply rejection, improved grounding, even-order harmonic rejection, and feedback stability, as well as more bandwidth, due to the fact that the output load line is ~4 times higher than a single-ended design, which reduces the impedance transformation ratio of the output matching network. This lower transformation ratio results in higher bandwidth.

Referring to FIG. 1, a differential power amplifier 10 is shown. The design shown in FIG. 1 has a differential output stage represented by amplifiers 42 and 44. The differential power amplifier 10 is also coupled to an output matching network 11, which is discussed more fully in U.S. application Ser. No. 14/715,175, filed May 18, 2015, entitled "Output Matching Network for Differential Power Amplifier." The output matching network 11 comprises a power supply voltage VCC2 12 connected to capacitance 14 and a transformer 17 consisting of a pair of windings 16 and 18, which are coupled to a capacitance 20. This output matching network 11 is very small, high performance, and broadband.

The differential power amplifier 10 is shown having multiple stages. The differential power amplifier 10 includes an input stage 11, indicated by the dashed line. The portion of the differential power amplifier 10 outside the dotted line may be referred to as the output stage. A first stage input 22 is fed into an input stage amplifier 24 that is grounded via inductor 26. The differential power amplifier 10 also comprises power supply voltage VCC1 30. The input stage output 28 is coupled via capacitance 32 and a transformer 35 consisting of windings 34 and 36 to first and second output stage inputs 38 and 40 of a plurality of output stage amplifiers 42 and 44, respectively. In this manner, the input stage amplifier 24 has an input stage output 28, which provides a differential signal having a first portion and a second portion to the first and second output stage inputs 38 and 40 of a plurality of output stage amplifiers 42 and 44, respectively. The first output stage amplifier 42 has a first output stage output 43. The second output stage amplifier 44 has a second output stage output 45. The first and second output stage outputs 43 and 45 of the first and second output stage amplifiers 42 and 44 are coupled to capacitance 46 and to the transformer 17 of the output matching network 11. In some conditions, as described above, the output power of the differential power amplifier 10 may be swept high enough to damage the differential power amplifier and/or related filters.

It would be beneficial to limit power for differential power amplifiers during the mobile phone calibration stage, especially for those differential power amplifiers having envelope trackers, in order to avoid damaging SAW or BAW filters at the output of the differential power amplifier.

The present disclosure describes a differential interstage power limiter that is most effective under these unique operating conditions.

Several power limiter approaches were studied and the present inventors discovered that the most practical and accurate method to limit the power is by using a power or voltage limiter at each input of the output stage amplifiers. Most related art involves using diode limiters at the input of an input stage amplifier (Q1), or at the output of a single-ended output stage amplifier (Q2), as shown in FIGS. 2A and 2B.

FIGS. 2A and 2B show related art using diode limiters at the input of a first stage amplifier (Q1), or at an output of a single-ended output stage amplifier (Q2). FIG. 2A shows a first stage amplifier 50 (Q1) having input 22, similar to the input stage amplifier 24 in FIG. 1. A first pair of diodes 48A and 48B and a second pair of diodes 49A and 49B (one pair for each polarity) have been placed at the input 22 of the first stage amplifier 50. FIG. 2B shows a single-ended output stage amplifier 52 having an output 56, similar to the first and second output stage amplifiers 42 and 44 of FIG. 1. A first pair of diodes 54A and 54B and a second pair of diodes 55A and 55B (one pair for each polarity) have been placed at the output 56 of the output stage amplifier 52. Both of these diode limiters approaches—placing diodes at the input of a first stage amplifier (Q1) and/or placing diodes at an output of a single-ended output stage amplifier (Q2), have issues that cause them not to be desirable to limit power for a differential stage power amplifier. Placing diodes at the input of a first stage amplifier (Q1) has been shown to not effectively limit excess output power. Placing diodes at an output of a single-ended output stage amplifier (Q2) can be dangerous and is also ineffective at limiting excess output power.

During phone calibration, the first stage amplifier (Q1) collector supply voltage can exceed the normal operating condition, creating excessive drive level into the output stage (~5.5 V versus a 4.5 V maximum normal operating condition). Therefore, limiting power at the input of the input stage amplifier 50 has the obvious disadvantage of not depending on the input stage (Q1) collector supply voltage. However, it was still investigated to see if it could limit the output power caused by excess input drive level (which can reach 10 dBm versus a normal operating condition of around 2 dBm). Simulations were done with several different limiter structures at the input of the input stage amplifier. Table 1 summarizes the results of the two most promising approaches (Schottky diodes and transistor-connected diodes). The maximum peak output power required from the power amplifier is ~32 dBm. The simulations show that a power limiter located at an input of a first stage amplifier (Q1) was ineffective at limiting excess output power.

TABLE 1

| Pin (dBm) | Baseline Pout (dBm) | Schottky Limiter Pout (dBm) | Transistor Limiter Pout (dBm) |
|---|---|---|---|
| 0 | 31.13 | 31.04 | 31.08 |
| 5 | 34.70 | 34.55 | 34.63 |
| 10 | 35.83 | 35.77 | 35.83 |
| 15 | 35.85 | 35.87 | 35.89 |

Placing a voltage limiter at the output of an output stage amplifier (Q2) was also discovered to have problems. To consider a voltage limiter at an output of an output stage amplifier, the voltage waveforms into a 2:1 VSWR were first investigated because the impedance seen at the output of an output stage amplifier varies widely with VSWR changes, which means the output power can be greatly different for the same output voltage swing.

Figure 3A:
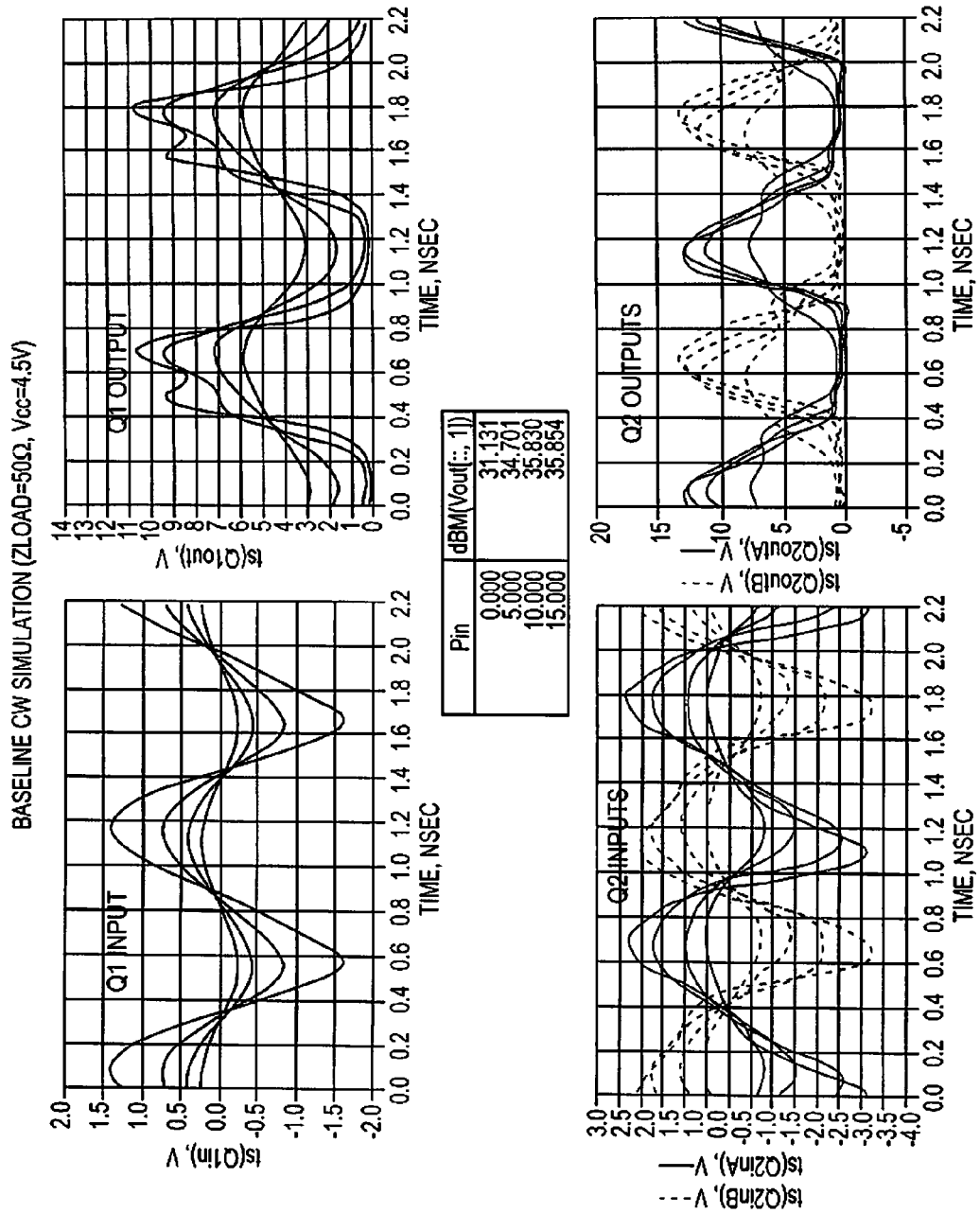
FIGS. 3A and 3B show simulations of 1:1 and 2:1 load VSWR associated with a limiter placed at the output of a single-ended second stage (Q2) amplifier.
Figure 3B:
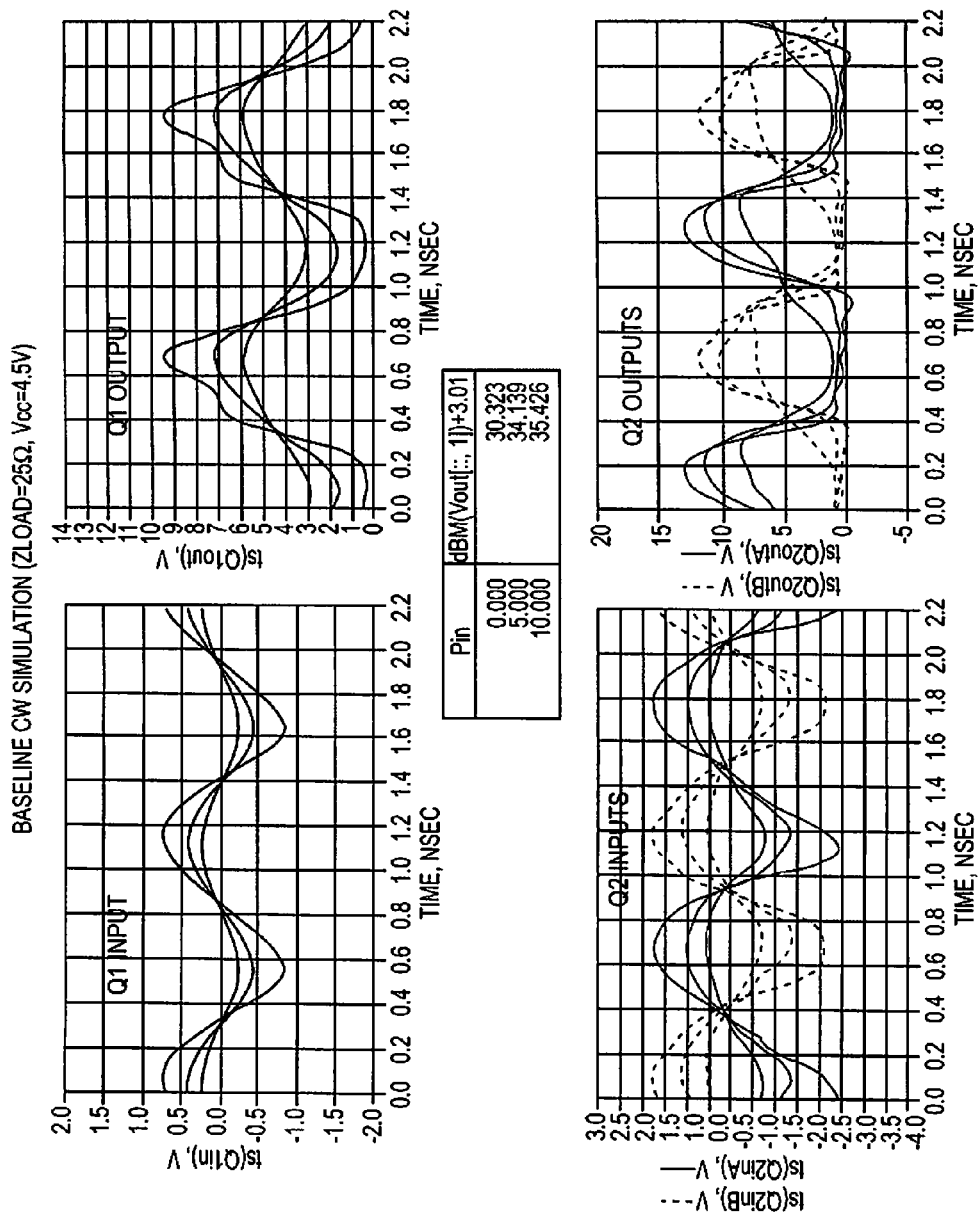

FIGS. 3A and 3B show the results of two different simulations: Zload=50 ohms and Zload=25 ohms. At Zload=50 ohms a peak envelope power of 32 dBm is achieved at an input drive level of ~2 dBm. The peak collector voltage at that power is ~9 V. Reviewing the Zload=25 ohm waveform makes clear that there is little to no way to effectively limit the output power for a limiter that activates above 9 V. Accordingly, placing a voltage limiter at the output of an output stage amplifier (Q2) is not feasible.

In order to effectively limit the excess output power of a differential power amplifier, power limiter circuitry that is connected to an input of at least one of a plurality of output stage amplifiers is disclosed.

Figure 4A:
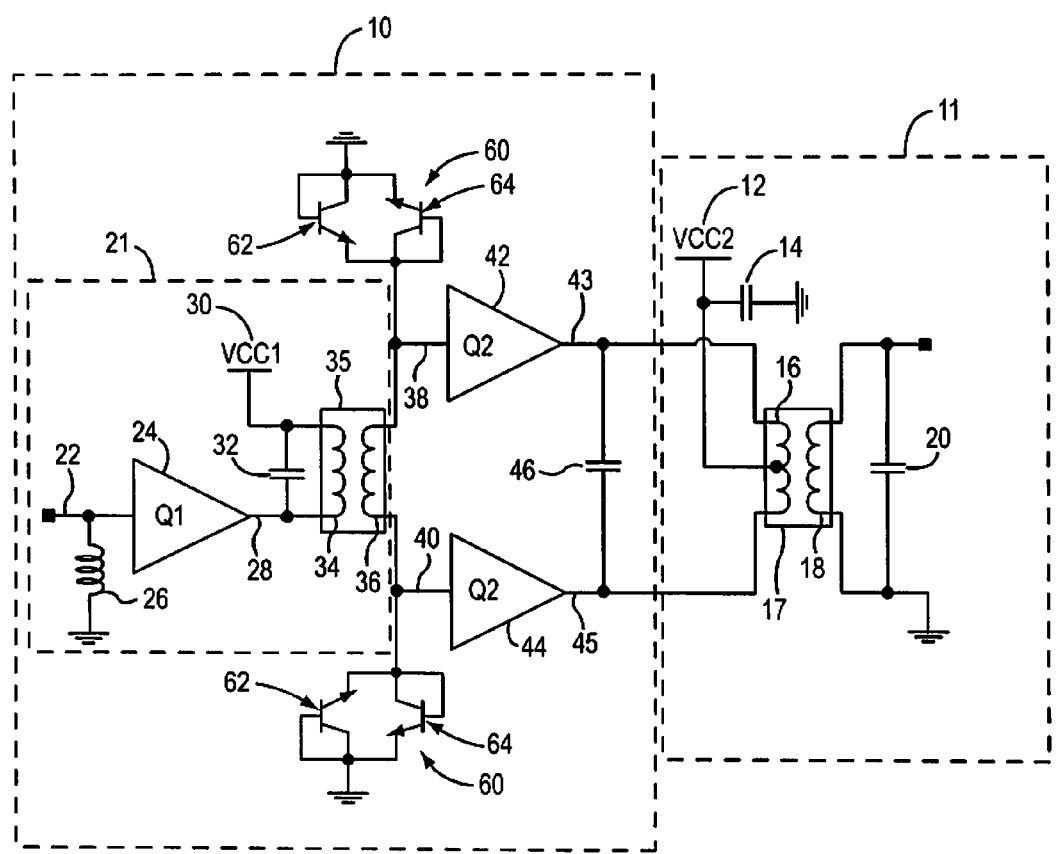
FIG. 4A is a schematic of a differential multistage power amplifier having power limiter circuitry connected to an input of each of a plurality of output stage amplifiers according to one exemplary embodiment.

FIG. 4A is a schematic of a differential multistage power amplifier having a power limiter connected to an input of each of a plurality of output stage amplifiers, according to one exemplary embodiment. FIG. 4A shows a differential power amplifier similar to that disclosed in FIG. 1, and as such the description of the differential power amplifier 10 will not be repeated. Power limiter circuitry 60 may be connected to an input (Q2 input) of each of the plurality of output stage amplifiers 42 and 44 such that a first power limiter circuitry 60 is connected to the first output stage input 38 of the first output stage amplifier 42 and separate power limiter circuitry 60 is also connected to the second output stage input 40 of the second output stage amplifier 44. The power limiter circuitry 60 are thus configured to limit the power of the differential signal that is input into the first and second output stage amplifiers 42 and 44 from the output of the input stage 21.

In one embodiment, the power limiter circuitry 60 is included on the same integrated circuit chip die as the input stage 21 and the first and second output stage amplifiers 42 and 44. However, the power limiter circuitry 60 could also be located on a separate integrated circuit chip in another embodiment.

The power limiter circuitry 60 can take any form capable of limiting power. The power limiter 60 circuitry can be implemented in circuitry in one embodiment. In one embodiment, the power limiter circuitry 60 may include a plurality of transistors 62 and 64, as seen in FIG. 4A. Non-limiting examples of power limiters that may be used as power limiter circuitry 60 can be seen in FIGS. 5-8. The power limiter circuitry 60 is configured to limit the voltage at the differential power amplifier 10 such that the differential power amplifier 10 and associated filters are not damaged, while the nominal performance of the differential power amplifier at rated power is not significantly affected.

Although FIG. 4A shows a single input stage amplifier 24 and a pair of output stage amplifiers 42 and 44, any number of stages and amplifiers may be used in a given power amplifier design. For example, the input stage amplifier 24 could itself be replaced by a multistage differential power amplifier, such as differential power amplifier 10 of FIG. 1.

Figure 4B:
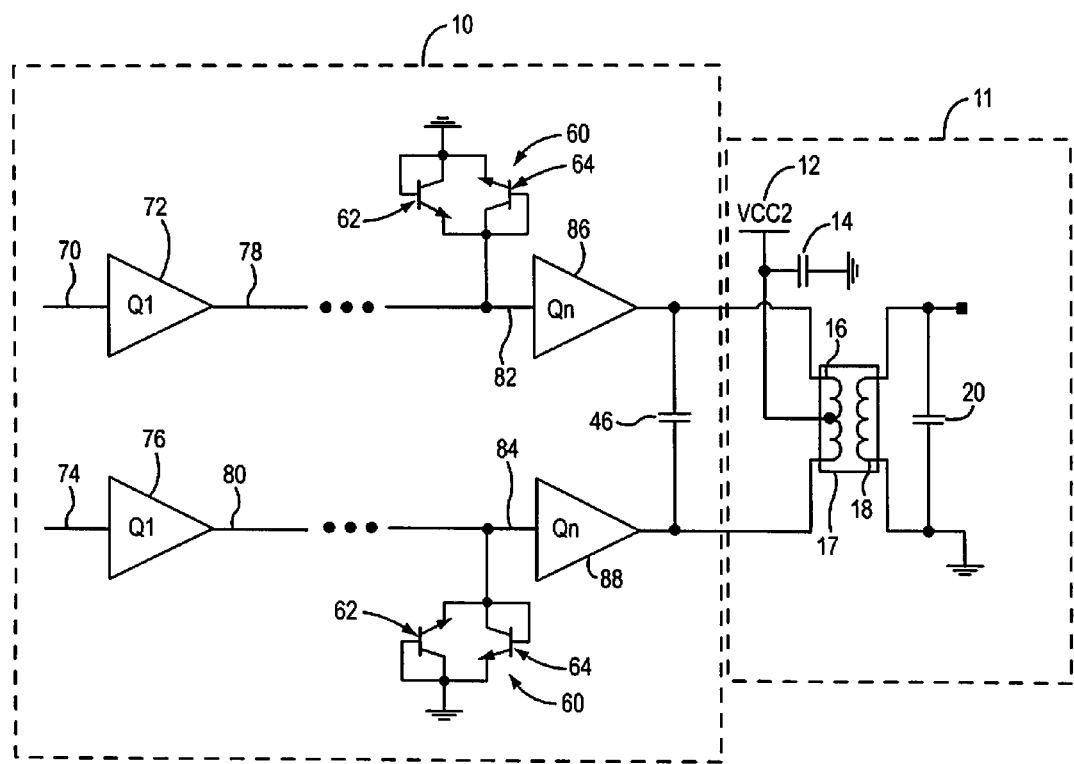
FIG. 4B is a schematic of a differential multistage power amplifier having a number n of multiple stages, wherein each stage has a plurality of amplifiers, and wherein power limiter circuitry is connected to an input of each of a plurality of last output stage amplifiers, according to another exemplary embodiment.

In one embodiment, as shown in FIG. 4B, a differential multistage power amplifier may have a number n of multiple stages, wherein each stage has a plurality of amplifiers, and wherein power limiter circuitry is connected to an input of each of a plurality of last output stage amplifiers. A first input stage (Q1) is represented by an input 70 to a first input stage (Q1) amplifier 72 and an input 74 to a second first stage (Q1) amplifier 76. The first input stage thus comprises the first input stage amplifier 72 having an output 78 and the second first input stage amplifier 76 having an output 80. Any number of stages may be present between the first stage and a last, output stage, until outputs of a given n−1 stage are coupled to Qn inputs 82 and 84 of a plurality of last output stage Qn amplifiers 86 and 88. Power limiter circuitry 60 may be connected to each of the Qn inputs 82 and 84 of the last output stage amplifiers 86 and 88. The power limiter circuitry 60 are thus configured to limit the power of the signal that is input into the last output stage amplifiers 86 and 88 from the output of the previous stage.

Although FIG. 4B only shows a pair of power limiters 60 before the last output stage Qn of amplifiers, it should be understood that power limiter circuitry can be connected to inputs of any of the previous stages of amplifiers in between the first input stage (Q1) amplifiers 72 and 76 and any subsequent later stage of amplifiers.

Figure 4C:
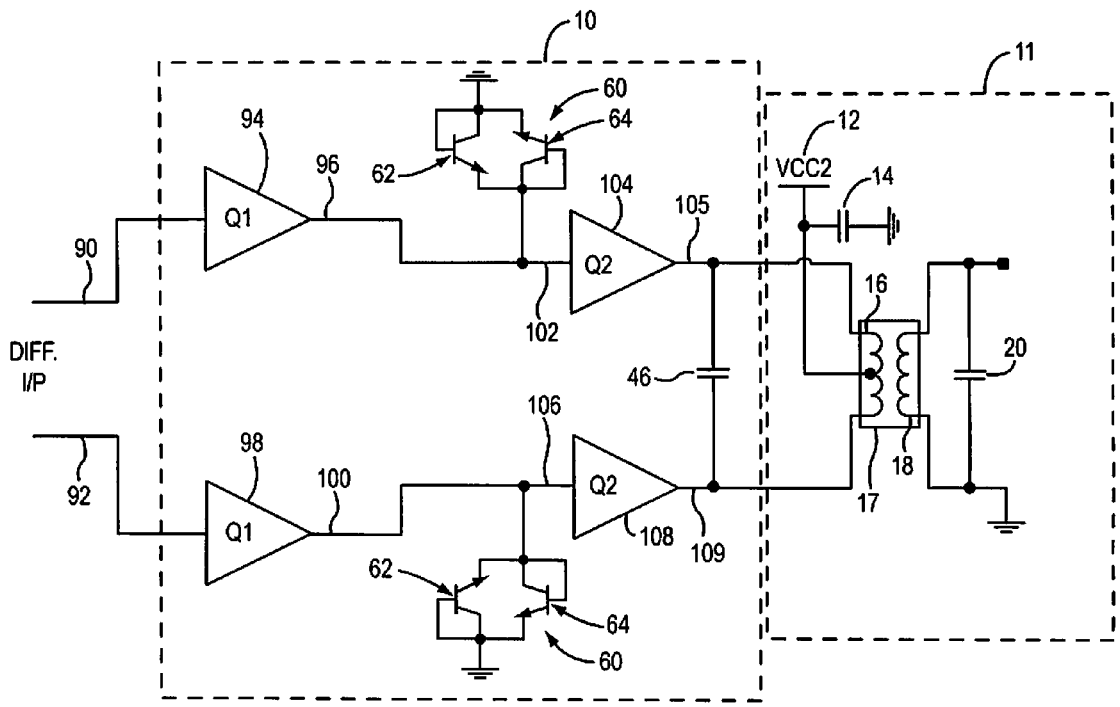
FIG. 4C is a schematic of a differential multistage power amplifier having a plurality of stages, wherein there are multiple differential inputs to a first stage of amplifiers, and wherein power limiter circuitry is connected to an input of each of a plurality of last output stage amplifiers, according to another exemplary embodiment.

FIG. 4C is a schematic of a differential multistage power amplifier having a plurality of stages, wherein there are multiple differential inputs to a first input stage of amplifiers, and wherein power limiter circuitry is connected to an input of each of a plurality of last output stage amplifiers, according to another exemplary embodiment. In the embodiment of FIG. 4C, there are multiple differential inputs 90 and 92 for a pair of input stage amplifiers (Q1) 94 and 98 having outputs 96 and 100. The Q1 outputs 96 and 100 are coupled directly to inputs 102 and 106, respectively, of first and second output stage amplifiers (Q2) 104 and 108, having first and second output stage outputs 105 and 109, respectively. As in FIG. 4A, power limiter circuitry 60 is connected to an input of each of the plurality of output stage amplifiers 104 and 108 (first output stage input 102 and second output stage input 106, respectively) such that the power limiter circuitry 60 is configured to limit the voltage of the differential power amplifier, wherein the differential power amplifier and associated filters are not damaged, and the nominal performance of the differential power amplifier at rated power is not significantly affected. As seen in FIG. 4C, the power limiter circuitry 60 may include a plurality of transistors 62 and 64, but may also take the form of any of the non-limiting examples of power limiters in FIGS. 5-8. As seen in FIG. 4C, the power limiter circuitry 60 can be used even where there are multiple differential inputs and multiple first stage amplifiers. The power limiter circuitry 60 are thus configured to limit the power of the signal that is input into the first and second output stage amplifiers 104 and 108 from the output of the first input stage (Q1) amplifiers 94 and 98.

Figure 4D:
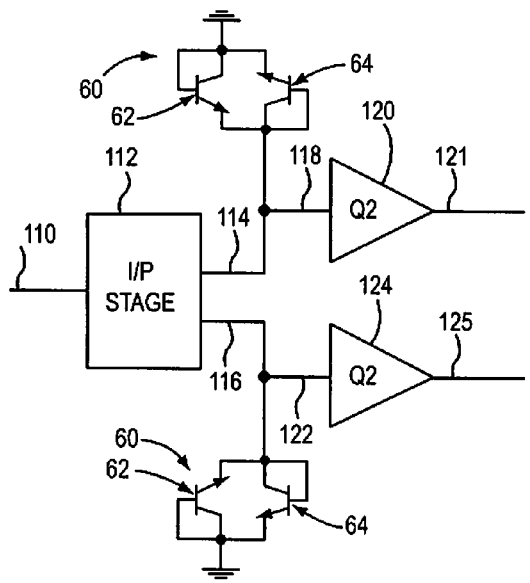
FIG. 4D is a schematic of a differential multistage power amplifier having an input stage and a differential stage, wherein there is a single input to the input stage, and wherein power limiter circuitry is connected to an input of each of a plurality of differential stage amplifiers, according to another exemplary embodiment.

FIG. 4D is a schematic of a differential multistage power amplifier having an input stage and a differential stage, wherein there is a single input to the input stage, and wherein power limiter circuitry is connected to an input of each of a plurality of differential stage amplifiers, according to another exemplary embodiment. An input 110 is fed into a differential input stage 112 having a pair of outputs 114 and 116. In this manner, the differential input stage 112 provides a differential signal having a first portion and a second portion to the first and second output stage inputs 118 and 122 of a plurality of output stage amplifiers 120 and 124, respectively. The first portion of the differential signal is received at a first output stage input 118 of first output stage amplifier 120 having a first output stage output 121, while the second portion is received at a second output stage input 122 of a second output stage amplifier 124 having a second output stage output 125. Power limiter circuitry 60 is connected to each of the first and second output stage inputs 118 and 122 of first and second output stage amplifiers 120 and 124, respectively, to limit the power output by the first and second output stage amplifiers 120 and 124. The power limiter circuitry 60 are positioned between the different input stage 112 and the respective first and second output stage amplifiers 120 and 124, and are connected to the inputs 118 and 122 of the first and second output stage amplifiers 120 and 124. In this manner, the power limiter circuitry 60 are configured to limit the voltage from the differential input stage 112 that is input into the first and second output stage amplifiers 120 and 124 connected to the differential input stage such that the differential power amplifier and associated filters are not damaged, while the nominal performance of the differential power amplifier at rated power is not significantly affected.

As mentioned above, the power limiter circuitry 60 can take any form that limits power. The power limiter circuitry 60 can be implemented in circuitry in one embodiment. The power limiter circuitry 60 is configured to limit the voltage at the differential power amplifier such that the differential power amplifier and associated filters are not damaged, while the nominal performance of the differential power amplifier at rated power is not significantly affected. Non-limiting examples of power limiter circuitry that may be used as a power limiter can be seen in FIGS. 5-8.

Figure 5:
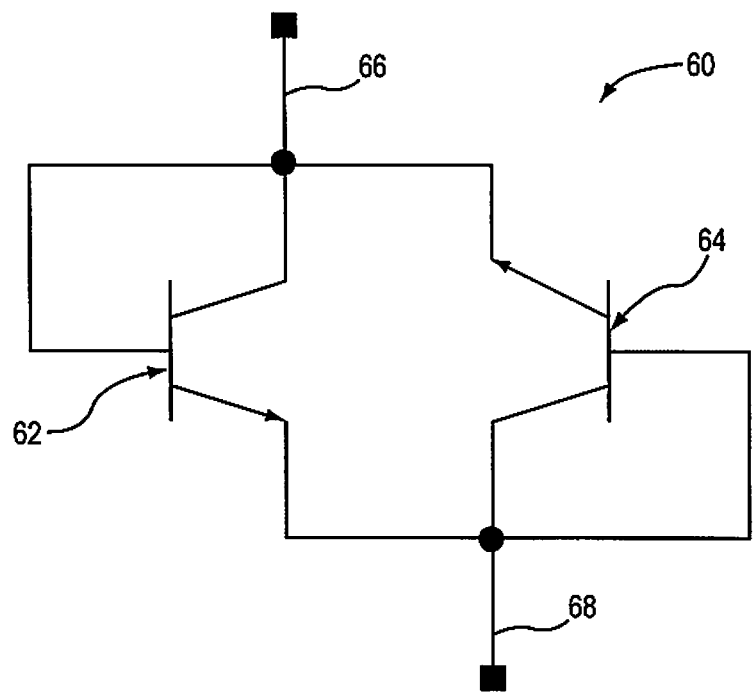
FIG. 5 shows power limiter circuitry comprising a pair of anti-parallel diode connected transistors, according to one exemplary embodiment.

FIG. 5 shows power limiter circuitry comprising a pair of anti-parallel diode connected transistors, according to one exemplary embodiment. Power limiter circuitry comprises a pair of anti-parallel diode connected transistors 62 and 64. The power limiter circuitry 60 has a plus polarity and a minus polarity such that it is bidirectional. One input/output of the power limiter circuitry 60, such as input/output 66 may be grounded, and the other input/output of the power limiter circuitry 60, such as input/output 68, is connected to the input of a output stage amplifier, such as input 38 or input 40 of FIG. 4A. The power limiter circuitry 60 thus is configured to limit the power of the signal that is input into the output stage amplifier.

Figure 6:
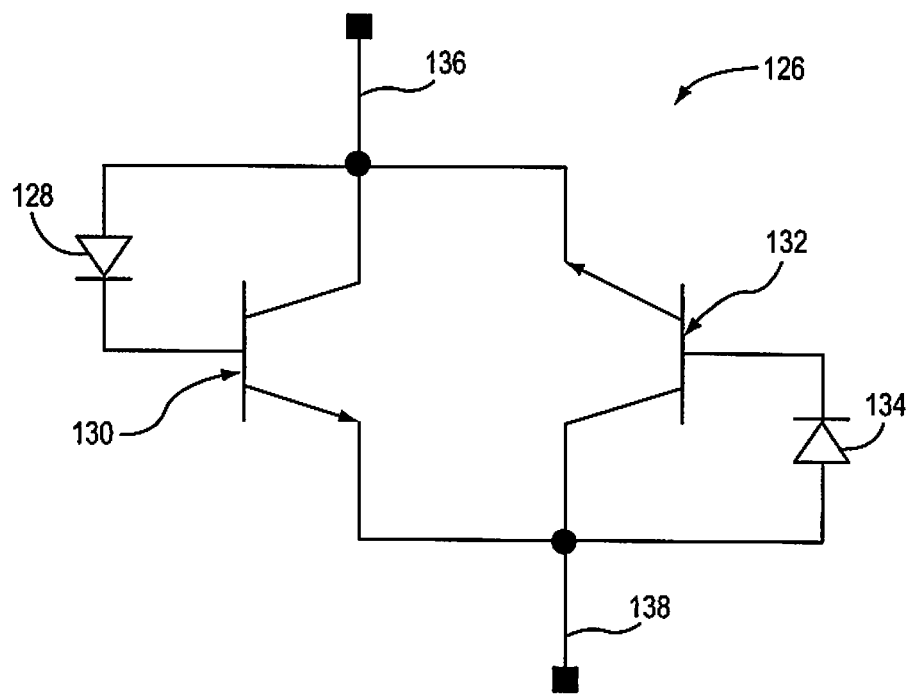
FIG. 6 shows power limiter circuitry comprising a pair of anti-parallel diode connected transistors with a single diode connected to each of the plurality of anti-parallel diode connected transistors, according to one exemplary embodiment.

FIG. 6 shows power limiter circuitry comprising a pair of anti-parallel diode connected transistors with a single diode connected to each of the plurality of anti-parallel diode connected transistors, according to one exemplary embodiment. In FIG. 6, power limiter circuitry 126 comprises a pair of anti-parallel diode connected transistors 130 and 132. A single diode 128 is connected to one of the pair of anti-parallel diode connected transistors 130. Another single diode 134 is connected to the other one of the pair of anti-parallel diode connected transistors 132. The diodes 128 and 134 are for opposite polarities. One input/output of the power limiter circuitry 126, such as input/output 136 may be grounded, and the other input/output of the power limiter circuitry 126, such as input/output 138, is connected to the input of a second or later stage transistor, such as input 38 or input 40 of FIG. 4A. The power limiter circuitry 126 thus is configured to limit the power of the signal that is input into the output stage amplifier.

Figure 7:
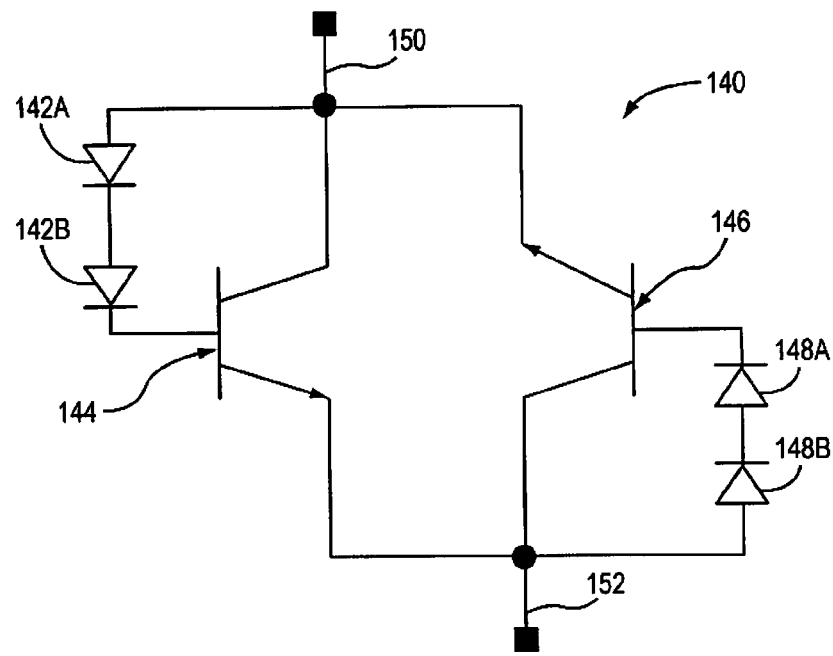
FIG. 7 shows power limiter circuitry comprising a pair of anti-parallel diode connected transistors with a plurality of series connected diodes connected to each of the plurality of anti-parallel diode connected transistors, according to one exemplary embodiment.

FIG. 7 shows power limiter circuitry comprising a pair of anti-parallel diode connected transistors with a plurality of series connected diodes connected to each of the plurality of anti-parallel diode connected transistors, according to one exemplary embodiment. In FIG. 7, power limiter circuitry 140 comprises a pair of anti-parallel diode connected transistors 144 and 146. A plurality of series connected diodes 142A and 142B is connected to one of the pair of anti-parallel diode connected transistors 144. Another plurality of series connected diodes 148A and 148B is connected to the other one of the pair of anti-parallel diode connected transistors 146. The plurality of series connected diodes 142A, 142B and 148A, 148B, are for opposite polarities. One input/output of the power limiter circuitry 140, such as input/output 150, may be grounded, and the other input/output of the power limiter circuitry 140, such as input/output 152, is connected to the input of output stage amplifier, such as input 38 or input 40 of FIG. 4A. The power limiter circuitry 140 thus is configured to limit the power of the signal that is input into an output stage amplifier.

Figure 8:
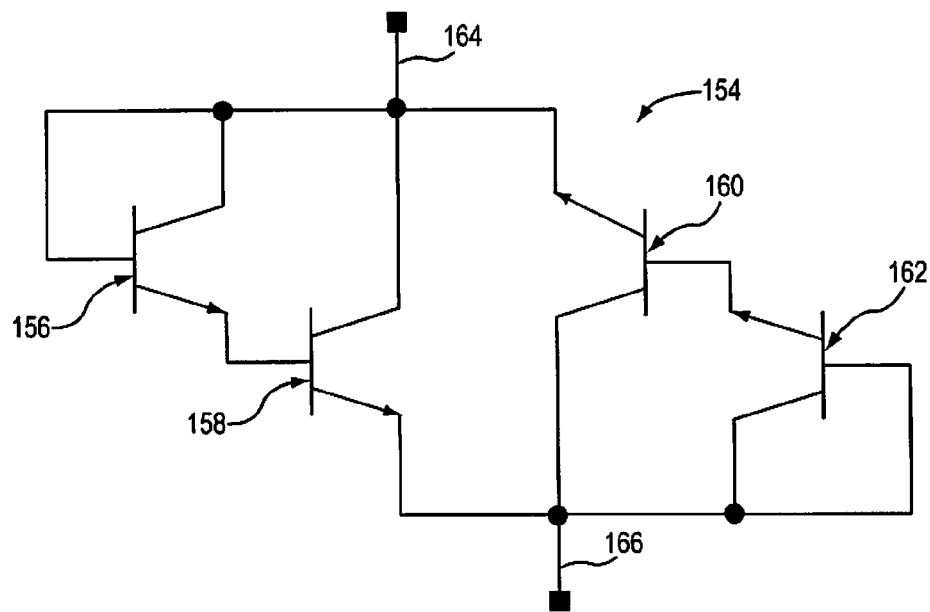
FIG. 8 shows power limiter circuitry comprising a Darlington transistor circuit, according to one exemplary embodiment.

FIG. 8 shows power limiter circuitry comprising a Darlington transistor circuit, according to one exemplary embodiment. A Darlington transistor circuit 154 comprises transistors 156, 158, 160, and 162. The transistors 156 and 158 act as a transistor pair for one polarity and the transistors 160 and 162 work as a transistor pair for the other polarity. One input/output of the Darlington transistor circuit 154, such as input/output 164, may be grounded, and the other input/output of the Darlington transistor circuit 154, such as input/output 166, is connected to the input of output stage amplifier, such as input 38 or input 40 of FIG. 4A. The Darlington transistor circuit 154 thus is configured to limit the power of the signal that is input into the output stage amplifier.

Testing of the power limiter circuitry 60 shown in FIG. 5 indicates that the power limiter circuitry 60 reduces the output power of the differential power amplifier without adversely affecting the performance of the differential power amplifier. CW simulations of the power amplifier are shown in Table 2 with and without the power limiter. The results show ~1.5 dB of output power reduction (at Pin=10 dBm and Vcc=5.5 V) without significantly affecting the output power below 32 dBm.

TABLE 2

|  | Baseline Pout (dBm) | Transistor Limiter Pout (dBm) |
|---|---|---|
| Vcc = 4.5 Pin (dBm) | | |
| 0 | 31.13 | 31.07 |
| 5 | 34.70 | 33.92 |
| 10 | 35.83 | 34.82 |
| 15 | 35.85 | 35.08 |
| Vcc = 5.5 Pin (dBm) | | |
| 0 | 32.18 | 32.13 |
| 5 | 35.95 | 34.95 |
| 10 | 37.55 | 36.07 |
| 15 | 37.51 | 36.52 |

Simulations with WCDMA modulation are shown in Table 3. The results show that the power limiters have an insignificant effect on the nominal performance at rated power.

TABLE 3

|  | Baseline | Transistor Limiter |
|---|---|---|
| Gain (dB) | 30.08 | 30.01 |
| PAE (%) | 40.12 | 40.08 |
| ACLR1 (dBc) | −40.20 | −39.79 |
| EVM (%) | 2.94 | 3.09 |

Accordingly, placing power limiter circuitry on an input of a output stage amplifier (Q2) will not be greatly affected by impedance changes due to VSWR shifts on the output of the differential power amplifier, and thus the power limiter will perform well under conditions of varying VSWR.

By connecting power limiter circuitry to an input of an output stage amplifier in a differential power amplifier that has at least a first, input stage and a second, output stage, the output power voltage of the differential power amplifier is reduced. As a result, the differential power amplifier and associated filters are not damaged, while the nominal performance of the differential power amplifier at rated power is not significantly affected, even during conditions of high drive level and high power supply voltage, such as during mobile phone calibration of mobile phones containing envelope trackers and reduced size SAW or BAW duplex filters.

Those skilled in the art will recognize improvements and modifications to the present disclosure. All such improvements and modifications are considered within the scope of the concepts disclosed herein.

What is claimed is:

1. A differential power amplifier comprising:
an input stage having at least one input and at least one output, the input stage configured to provide a differential signal having a first portion and a second portion;
a first output stage amplifier configured to receive the first portion of the differential signal at a first output stage input and provide a first amplified signal at a first output stage output;
a second output stage amplifier configured to receive the second portion of the differential signal at a second output stage input and provide a second amplified signal at a second output stage output; and
first power limiter circuitry connected to the first output stage input and configured to limit a power level of the first portion of the differential signal prior to being received at the first output stage input by the first output stage amplifier.

2. The differential power amplifier of claim 1, wherein the input stage comprises input stage circuitry including an amplifier.

3. The differential power amplifier of claim 1, wherein the input stage comprises a plurality of amplifiers.

4. The differential power amplifier of claim 1, further comprising second power limiter circuitry connected to the second output stage input and configured to limit a power level of the second portion of the differential signal prior to being received at the second output stage input by the second output stage amplifier.

5. The differential power amplifier of claim 1, wherein the first power limiter circuitry comprises a plurality of anti-parallel diode connected transistors.

6. The differential power amplifier of claim 5, wherein the first power limiter circuitry further comprises a single diode connected to each of the plurality of anti-parallel diode connected transistors.

7. The differential power amplifier of claim 5, wherein the first power limiter circuitry further comprises a plurality of series connected diodes connected to each of the plurality of anti-parallel diode connected transistors.

8. The differential power amplifier of claim 1, wherein the first power limit circuitry comprises a Darlington transistor circuit.

9. The differential power amplifier of claim 1, wherein the first power limiter circuitry is included on an integrated circuit chip die that also includes the input stage, the first output stage amplifier, and the second output stage amplifier.

10. The differential power amplifier of claim 1, wherein the first power limiter circuitry is located on a separate integrated circuit chip than an integrated circuit chip that includes the input stage, the first output stage amplifier, and the second output stage amplifier.

11. The differential power amplifier of claim 1, further comprising at least one additional stage comprising a plurality of amplifiers between the input stage and the first and second output stage amplifiers.

12. The differential power amplifier of claim 11, further comprising at least one additional power limiter at an input of at least one of the plurality of amplifiers between the input stage and the first and second output stage amplifiers.

13. The differential power amplifier of claim 1, wherein the input stage further comprises a transformer.

14. The differential power amplifier of claim 13, wherein the transformer comprises a pair of windings.

15. The differential power amplifier of claim 13, further comprising a first capacitance coupled to a voltage supply and to the at least one output of the input stage.

16. The differential power amplifier of claim 15, further comprising a second capacitance coupled to the first output stage output of the first output stage amplifier and to the second output stage output of the second output stage amplifier.

17. A differential power amplifier comprising:
a differential input stage comprising a plurality of input stage amplifiers, each of the plurality of input stage amplifiers having at least one input and at least one output, wherein a first input stage amplifier of the plurality of input stage amplifiers is configured to provide a first differential signal and a second input stage amplifier of the plurality of input stage amplifiers is configured to provide a second differential signal;
a first output stage amplifier configured to receive the first differential signal at a first output stage input and provide a first amplified signal at a first output stage output;
a second output stage amplifier configured to receive the second differential signal at a second output stage input and provide a second amplified signal at a second output stage output;
first power limiter circuitry connected to the first output stage input and configured to limit a power level of the first differential signal prior to being received at the first output stage input by the first output stage amplifier; and
second power limiter circuitry connected to the second output stage input and configured to limit a power level of the second differential signal prior to being received at the second output stage input by the second output stage amplifier.

18. The differential power amplifier of claim 17, wherein at least one of the first and second power limiter circuitry comprises a plurality of anti-parallel diode connected transistors.

19. The differential power amplifier of claim 18, wherein at least one of the first and second power limiter circuitry comprises a single diode connected to each of the plurality of anti-parallel diode connected transistors.

20. The differential power amplifier of claim 17, wherein at least one of the first and second power limiter circuitry comprises further comprises a plurality of series connected diodes connected to each of the plurality of anti-parallel diode connected transistors.

21. The differential power amplifier of claim 17, wherein at least one of the first and second power limiter circuitry comprises a Darlington transistor circuit.

22. The differential power amplifier of claim 17, wherein the differential input stage further comprises a transformer comprising a pair of windings.

23. The differential power amplifier of claim 17, further comprising a first capacitance coupled to a voltage supply and to the at least one output of the differential input stage.

24. The differential power amplifier of claim 23, further comprising a second capacitance coupled to the first output stage output of the first output stage amplifier and to the second output stage output of the second output stage amplifier.

* * * * *